(12) United States Patent
Ye et al.

(10) Patent No.: US 8,460,519 B2
(45) Date of Patent: *Jun. 11, 2013

(54) PROTECTIVE OFFSET SPUTTERING

(75) Inventors: Mengqi Ye, San Jose, CA (US);
Zhendong Liu, San Jose, CA (US);
Peijun Ding, Saratoga, CA (US)

(73) Assignee: Applied Materials Inc., Santa Clara, CA (US)

( * ) Notice: Subject to any disclaimer, the term of this patent is extended or adjusted under 35 U.S.C. 154(b) by 716 days.

This patent is subject to a terminal disclaimer.

(21) Appl. No.: 11/389,610

(22) Filed: Mar. 23, 2006

(65) Prior Publication Data
US 2007/0095651 A1 May 3, 2007

Related U.S. Application Data

(63) Continuation-in-part of application No. 11/262,193, filed on Oct. 28, 2005, which is a continuation-in-part of application No. 11/260,899, filed on Oct. 28, 2005, now Pat. No. 7,884,032.

(51) Int. Cl.
*C23C 14/35* (2006.01)

(52) U.S. Cl.
USPC ............ 204/192.12; 204/192.15; 204/192.17; 204/192.18; 204/298.2; 204/298.23; 204/298.28

(58) Field of Classification Search
USPC ............ 204/192.12, 192.15, 192.17, 298.18, 204/298.2, 298.23, 298.28, 192.18
See application file for complete search history.

(56) References Cited

U.S. PATENT DOCUMENTS

| 4,756,810 | A | * | 7/1988 | Lamont et al. ............. 204/192.3 |
| 5,180,708 | A | * | 1/1993 | Harada et al. ................ 505/475 |
| 5,186,718 | A |   | 2/1993 | Tepman et al. |
| 5,536,330 | A |   | 7/1996 | Chen et al. |
| 5,665,214 | A | * | 9/1997 | Iturralde ................ 204/298.03 |
| 5,736,021 | A |   | 4/1998 | Ding et al. |
| 5,759,287 | A |   | 6/1998 | Chen et al. |
| 5,770,025 | A |   | 6/1998 | Kiyota |
| 5,885,750 | A |   | 3/1999 | Hsiao et al. |
| 5,937,303 | A | * | 8/1999 | Gardner et al. ............. 438/305 |
| 6,183,614 | B1 | * | 2/2001 | Fu ............................ 204/298.2 |
| 6,241,857 | B1 |   | 6/2001 | Yamada |

(Continued)

FOREIGN PATENT DOCUMENTS

| TW | 517175 | 1/2003 |
| WO | 2007/053317 | 5/2007 |
| WO | 2007053317 | 5/2007 |

OTHER PUBLICATIONS

PCTUS2006040822 International Search Report and Written Opinion dated Aug. 2, 2007.

(Continued)

*Primary Examiner* — Rodney McDonald
(74) *Attorney, Agent, or Firm* — Konrad Raynes Davda & Victor LLP (57) ABSTRACT

Sputtering in a physical vapor deposition (PVD) chamber may, in one embodiment, utilize a target laterally offset from and tilted with respect to the substrate. In another aspect, target power may be reduced to enhance film protection. In yet another aspect, magnetron magnets may be relatively strong and well balanced to enhance film protection. In another aspect, a shutter may be provided to protect the substrate in start up conditions. Other embodiments are described and claimed.

46 Claims, 7 Drawing Sheets

U.S. PATENT DOCUMENTS

| | | | |
|---|---|---|---|
| 6,258,707 | B1 | 7/2001 | Uzoh |
| 6,277,722 | B1 | 8/2001 | Lee et al. |
| 6,306,265 | B1 | 10/2001 | Fu et al. |
| 6,413,382 | B1 | 7/2002 | Wang et al. |
| 6,454,914 | B1* | 9/2002 | Nakamura ............... 204/192.17 |
| 6,503,050 | B2 | 1/2003 | Reimer et al. |
| 6,538,327 | B1 | 3/2003 | Lopatin et al. |
| 6,641,701 | B1 | 11/2003 | Tepman |
| 6,833,161 | B2 | 12/2004 | Wang et al. |
| 6,844,119 | B2* | 1/2005 | Nozawa et al. ................... 430/5 |
| 6,878,243 | B2* | 4/2005 | Breme ..................... 204/192.23 |
| 6,899,795 | B1* | 5/2005 | Dubs et al. ............... 204/192.12 |
| 6,916,398 | B2 | 7/2005 | Chen et al. |
| 6,946,408 | B2 | 9/2005 | Le et al. |
| 7,141,186 | B2 | 11/2006 | Abe et al. |
| 7,775,158 | B2 | 8/2010 | Ando |
| 7,884,032 | B2 | 2/2011 | Ye et al. |
| 2002/0046945 | A1* | 4/2002 | Hosokawa et al. ....... 204/298.18 |
| 2002/0086220 | A1* | 7/2002 | Nozawa et al. ................... 430/5 |
| 2003/0121608 | A1 | 7/2003 | Chen et al. |
| 2003/0224217 | A1 | 12/2003 | Byun et al. |
| 2004/0113211 | A1* | 6/2004 | Hung et al. .................... 257/407 |
| 2006/0096851 | A1 | 5/2006 | Lavitsky et al. |
| 2006/0096857 | A1 | 5/2006 | Lavitsky et al. |
| 2007/0095650 | A1 | 5/2007 | Ye et al. |
| 2007/0099438 | A1 | 5/2007 | Ye et al. |

OTHER PUBLICATIONS

International Preliminary Report on Patentability, May 8, 2008, for International Application No. PCT/US2006/040822, 9 pp.

International Search Report and Written Opinion, Aug. 2, 2007, for International Application No. PCT/US2006/040822, 15 pp.

Advisory Action for U.S. Appl. No. 11/262,193, dated Jul. 3, 2008, 3 pp. [7828.7110 (AdvAct)].

Appeal Brief for U.S. Appl. No. 11/262,193, dated Nov. 27, 2009, 39 pp. [7828.7110 (AppealBrief)].

Appeal Decision for U.S. Appl. No. 11/262,193, dated Apr. 30, 2012, 10 pp. [7828.7110 (AppealDecision)].

Examiner's Answer for U.S. Appl. No. 11/262,193, dated Jan. 19, 2010, 24 pp. [7828.7110 (ExaminerAnswer)].

Final Office Action 1 for U.S. Appl. No. 11/262,193, dated Apr. 24, 2008, 17 pp. [7828.7110 (FOA1)].

Final Office Action 2 for U.S. Appl. No. 11/262,193, dated Apr. 23, 2009, 21 pp. [7828.7110 (FOA2)].

Notice of Allowance 1 for U.S. Appl. No. 11/262,193, dated Jul. 11, 2012, 7 pp. [7828.7110 (NOA1)].

Office Action 1 for TW Application No. 95139573, dated Oct. 12, 2011, 44 pp. (includes English Summary of Official Letter & English Translation of Search Report and Claims) [7828.7110TW (OA1)].

Office Action 1 for U.S. Appl. No. 111262,193, dated Jun. 25, 2007, 11 pp. [7828.7110 (OA1)].

Office Action 2 for TW Application No. 95139573, dated Aug. 31, 2012, 35 pp. (includes English Summary of Official Action & English Translation of Claims) [7828.7110TW (OA2)].

Office Action 3 for U.S. Appl. No. 11/262,193, dated Oct. 17, 2008, 15 pp. [7828.7110 (OA3)].

Reply Brief for U.S. Appl. No. 11/262,193, dated Mar. 19, 2010, 9 pp. [7828.7110 (Reply Brief)].

Response to Final Office Action 1 for U.S. Appl. No. 11/262,193, dated Jun. 24, 2008, 9 pp. [7828.7110 (RFOA1-1)].

Response to Final Office Action 1 for U.S. Appl. No. 11/262,193, dated Sep. 24, 2008, 9 pp. [7828.7110 (RFOA1-2)].

Response to Office Action 1 for TW Application No. 95139573, dated Apr. 6, 2012, 37 pp. (Includes English of Claims) [7828.7110TW (ROA1)].

Response to Office Action 1 for U.S. Appl. No. 11/262,193, dated Nov. 26, 2007, 8 pp. [7828.7110 (ROA1)].

Response to Office Action 3 for U.S. Appl. No. 11/262,193, dated Jan. 21, 2009, 11 pp. [7828.7110 (ROA3)].

Applied Materials, Inc., "Applied Centura Gate Stack", [online], 2005 [retrieved on Aug. 3, 2005], retrieved from the Internet at <URL: http://www.appliedmaterials.com/products/fep_centura-dpn.html>, 5 pp.

Applied Materials, Inc "Applied Materials Product Overview 2005—Dielectric Deposition", retrieved prior to Oct. 28, 2005, 11 pp.

Applied Materials, Inc., "Applied Producer Dielectric Etch", [online], 2005, [retrieved on Aug. 3, 2005], retrieved from the Internet at <URL: http://www.appliedmaterials.comlproducts/producer_etch.html>, 2 pp.

Lek, C.M., B.J. Cho, C.H.Ang, S.S. Tan, W.Y. Loh, J.Z. Zhen, and C. Lap, "Impact of Decoupled Plasma Nitridation of Ultra-Thin Gate Oxide on the Performance of P-Channel MOSFETs", Letter to the Editor, Semiconductor Science and Technology, No. 17, May 17, 2002, 4 pp.

Nano-Tsunami.Com, "Applied Materials and IMEC Collaborate to Develop 45nm Transistor Technologies", [online] Jan. 13, 2005, [retrieved on Aug. 3, 2005], retrieved from the Internet at <URL: http://www.voyle.net/Nano%20Electronics%202005/Nano%20Electronics-2005-0002.htm>, 3 pp.

Williams Advanced Materials, "MRAM Technology Reviews", [online], 2005, [retrieved Aug. 19, 2005], retrieved from the Internet at <URL: http://www.williams-adv.com/tools/mram-technology-review.php>, 2 pp.

* cited by examiner

PROTECTIVE OFFSET SPUTTERING

RELATED APPLICATIONS

This application is a Continuation-in-part application of copending application Ser. No. 11/262,193, entitled Protective Offset Sputtering, filed Oct. 28, 2005 and assigned to the assignee of the present application, and is incorporated by reference in its entirety. This application is also a continuation-in-part application of copending application Ser. No. 11/260,899, entitled Thin Film Deposition, filed Oct. 28, 2005 and assigned to the assignee of the present application, and incorporated by reference in its entirety.

BACKGROUND

Physical vapor deposition (PVD), or sputtering, is one of the most commonly used processes in fabrication of integrated circuits and devices. PVD is a plasma process performed in a vacuum chamber where a negatively biased target (typically, a magnetron target) is exposed to a plasma of an inert gas having relatively heavy atoms (e.g., argon (Ar)) or a gas mixture comprising such inert gas. Bombardment of the target by ions of the inert gas results in ejection of atoms of the target material. The ejected atoms accumulate as a deposited film on a substrate placed on a substrate pedestal which generally faces the target.

DETAILED DESCRIPTION

In the following description, reference is made to the accompanying drawings which form a part hereof and which illustrate several embodiments. It is understood that other embodiments may be utilized and structural and operational changes may be made without departing from the scope of the descriptions provided.

Copending application Ser. No. 10/984,265, filed 8 Nov. 2004, entitled "PHYSICAL VAPOR DEPOSITION CHAMBER HAVING A ROTATABLE SUBSTRATE PEDESTAL" and copending application Ser. No. 10/984,291, filed 8 Nov. 2004, entitled "PHYSICAL VAPOR DEPOSITION CHAMBER HAVING AN ADJUSTABLE TARGET" and assigned to the assignee of the present application, describe a PVD chamber for depositing highly uniform thin films. The chamber includes a rotatable substrate pedestal. In one embodiment, the pedestal, during a film deposition, rotates at an angular velocity of about 10 to 100 revolutions per minute (RPM). In further embodiments, one or more sputtering targets are movably disposed above the pedestal. The orientation of the targets relative to the pedestal may be adjusted laterally, vertically or angularly. In one embodiment, the target may be adjusted between angles A (reference number 214) of about 0 degrees (that is parallel to the substrate surface) to about 90 degrees relative to the substrate surface (or the pedestal surface supporting the substrate). In another embodiment, the target may be adjusted between angles of about 15 to about 45 degrees relative to the substrate surface or support surface.

The trend of shrinking transistor sizes in integrated circuit (IC) manufacturing has often resulted in an associated shrinkage in the thickness of deposited layers. Such thin layers including thin dielectric layers or metal layers may be relatively susceptible to being damaged by the plasmas often associated with PVD sputtering. In accordance with one aspect of the present description, a PVD chamber is provided which can, it is believed, reduce the occurrence of plasma induced damage to thin dielectric or conductive layers during a PVD sputtering process. It is appreciated that in other applications, features other than the reduction or elimination of plasma induced damage may be utilized, depending upon the particular application. For example, very thin layer depositions may be achieved. In other applications, a high degree of uniformity of deposition may be achieved. It is appreciated that in other applications, benefits other than those explicitly described herein may be achieved utilizing features and techniques described herein or in accordance with the descriptions provided herein.

Figure 1:
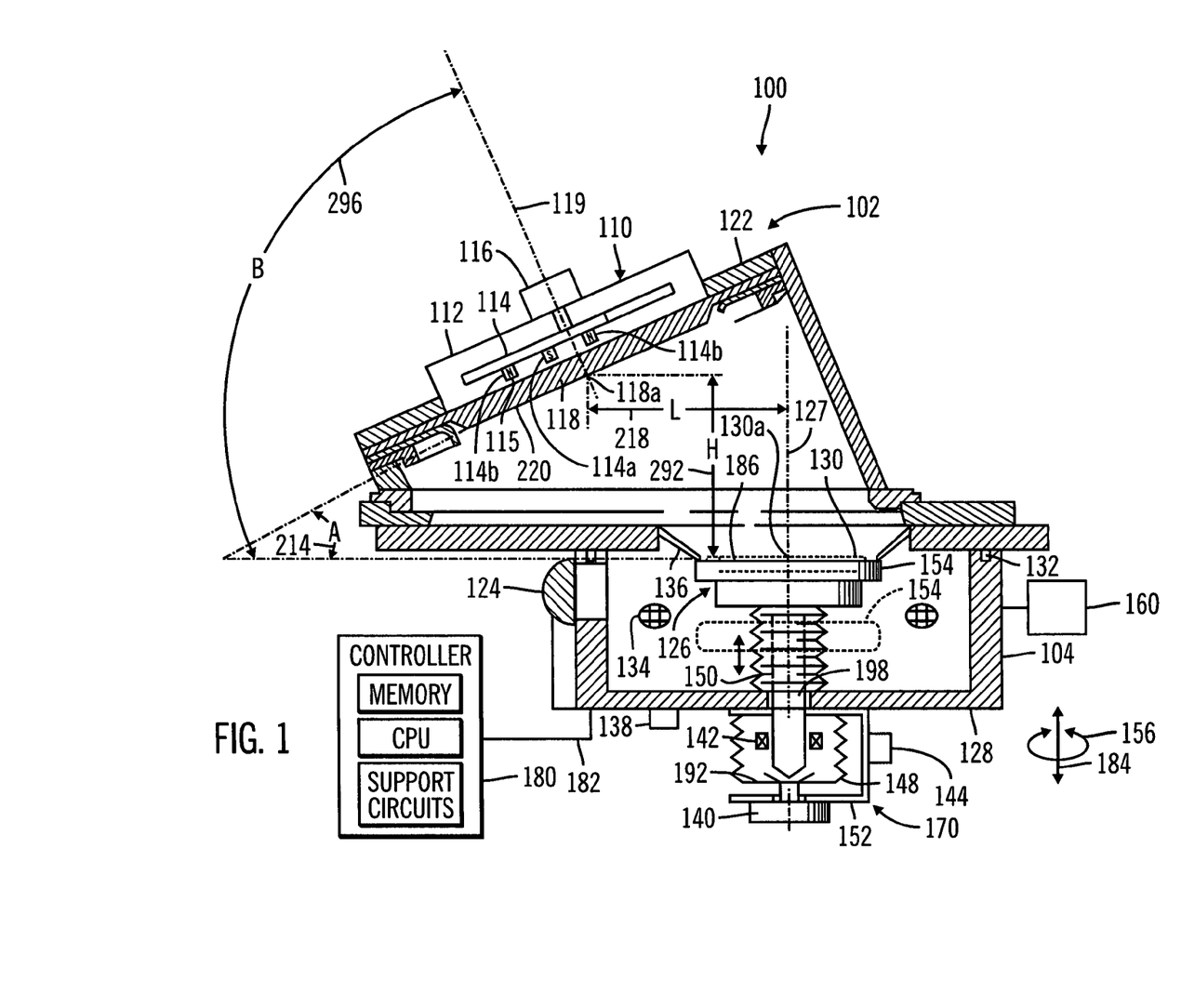
FIG. 1 is a schematic sectional view of one embodiment of a PVD chamber in accordance with the present description.

A PVD chamber in accordance with one embodiment of the present description is indicated generally at 100. The PVD chamber 100 generally comprises a lid assembly 102, a main assembly 104, a motion control unit 170, support systems 160, and a controller 180. In one embodiment, the lid assembly 102 includes a target assembly 110 and an upper enclosure 122. The target assembly 110 includes a rotatable magnetron pack 114 disposed within a target base 112 (e.g., water-cooled base), and a target 118. The magnetron pack 114 is mechanically coupled to a drive 116 that, in operation, rotates the pack at a pre-determined angular velocity about an axis 119. One magnetron pack that may be adapted to benefit from the invention is described in U.S. Pat. No. 6,641,701, issued Nov. 4, 2003 to A. Tepman, and is incorporated herein by reference in its entirety. The target assembly 110 is electrically coupled to a plasma power supply 188 (FIG. 6), such as an RF, DC, pulsed DC, power supply and the like.

In accordance with one aspect of the present description, the magnetron pack 114 includes relatively strong and relatively well balanced magnet poles 114a, 114b. As explained in greater detail below, such an arrangement can, it is believed, reduce ion induced damage to a thin film or other structure on a substrate 130.

Figure 3A:
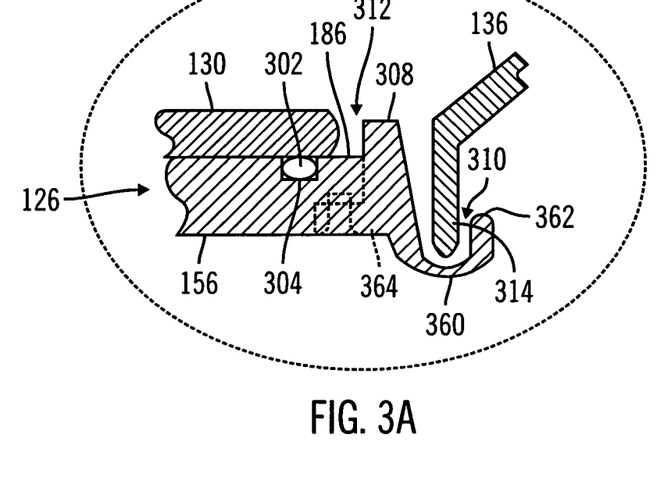
FIG. 3A is a partial cross-sectional view of the rotatable substrate pedestal of FIG. 1.
Figure 3B:
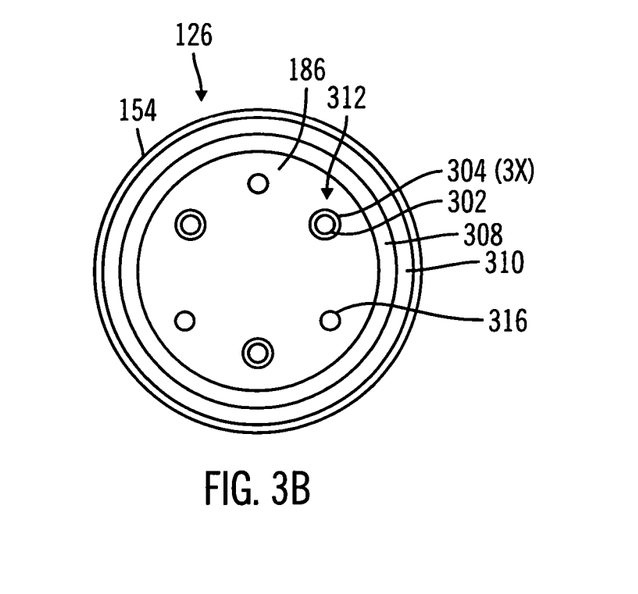
FIG. 3B is a top view of the substrate support pedestal of FIG. 1.

FIG. 1 depicts one embodiment of a PVD chamber 100 having a rotatable substrate pedestal 126. FIG. 3A depicts a partial cross-sectional view of the substrate pedestal 126. The cross-sectional view in FIG. 3A is taken along a radius of the substrate pedestal 126. The images in FIGS. 1, 3A and 3B are simplified for illustrative purposes and are not depicted to scale. For best understanding of this embodiment of the invention, the reader should refer simultaneously to FIGS. 1, 3A and 3B.

The pedestal 126 rotates about an axis 127 which, in the illustrated embodiment, passes through the center 130a of the substrate 130. It is appreciated that in other applications, the center 130a of the substrate 130 may be offset with respect to an axis of rotation of a rotatable pedestal. In the illustrated embodiment, the target 118 is tilted at an angle A with respect to the plane defined by the top surface of the substrate 130. It is believed that, rotation of the substrate 130 as target material is sputtered from the angled target 118 can increase the uniformity of thickness of deposition of sputtered target material onto the substrate 130.

In accordance with another aspect of the present description, the center 118a of the target 118 is laterally displaced a distance L (reference number 218) from the center 130a of the substrate 130. As explained in greater detail below, providing a relatively large lateral distance between the magnet poles 114a, 114b and the target 118 on the one hand, and the substrate 130 on the other hand, can, it is believed, also contribute to a reduction or elimination of plasma induced damage to a film on the substrate 130.

The support systems 160 comprise various apparatuses that, collectively, facilitate functioning of the PVD chamber 100. Illustratively, the support systems 160 include one or more sputtering power supplies, one or more vacuum pumps, sources of a sputtering gas and/or gas mixture, control instruments and sensors, and the like known to those skilled in the art.

The controller 180 comprises a central processing unit (CPU), a memory, and support circuits (none is shown). Via an interface 182, the controller 180 is coupled to and controls components of the PVD chamber 100, as well as deposition processes performed in the chamber.

In accordance with yet another aspect of the present description, a power supply 188 of the support system 160 coupled to the target 118 can provide a biasing voltage applied to the target 118 at a relatively low power. As explained in greater detail below, such reduced power can, it is believed, also contribute to a reduction or elimination of plasma induced damage to a film on a substrate 130.

In accordance with still another aspect of the present description, a pump and gas supplies of the support system 160 can provide an intermediate chamber pressure during the sputtering process. As explained in greater detail below, such intermediate process pressure can, it is believed, also contribute to a reduction or elimination of plasma induced damage to a film on a substrate 130.

In one embodiment, the main assembly 104 includes a chamber body 128, the rotatable substrate pedestal 126, an inverted shield 136 circumferentially attached to the body 128, and a plurality of radiant heaters 134. The shield 136 generally extends from the upper portion of the chamber body 128 downward and inward toward the pedestal 126. The substrate pedestal 126 includes a substrate platen 154 and a column module 150 that are coupled to one another. Vacuum-tight coupling between the lid assembly 102 and the main assembly 104 is illustratively provided by at least one seal, of which an o-ring 132 is shown. The radiant heaters 134 (e.g., infrared (IR) lamps, and the like) are generally used to preheat the internal parts of the chamber 100 to a temperature determined by a specific process recipe for preconditioning of the chamber (for example, chamber bake out). As the radiant heaters 134 are positioned below the shield 136, the heaters 134 are protected from deposition of the sputtered target material that may adversely affect heater performance.

A substrate 130 (e.g., silicon (Si) wafer, and the like) is introduced into and removed from the PVD chamber 100 through a slit valve 124 in the chamber body 128. The substrate may be cooled by water or heated by resistive elements incorporated inside the substrate holder.

In operation, the platen 154 may be selectively disposed in an upper processing position (as shown) or in a lower transfer position (shown in phantom). During wafer processing (i.e., sputter deposition), the platen 154 is raised to the upper position located at a pre-determined height H (reference number 292) from the target 118. To receive or release the substrates 130, the platen 154 is moved to the lower position substantially aligned with the slit valve 124 to facilitate robotic transfer of the substrate.

Referring to the embodiment depicted in FIGS. 3A-B, the platen 154 includes at least one polymer member disposed in an upper substrate supporting surface 186 of the platen 154. The polymer member may be a suitable plastic or elastomer. In one embodiment, the polymer member is an o-ring 302 disposed in a groove 304. In operation, friction between the substrate 130 and the o-ring 302 prevents the wafer from slipping along a substrate supporting surface 186 of the rotating platen 154. Three o-rings 302 are shown in the top view of the pedestal 126 of FIG. 3B spaced between lift pin holes 316. Alternatively, a single o-ring 302 as shown in FIG. 3A may be disposed along the perimeter of the supporting surface 186 to prevent the substrate from slipping as the substrate rotates during processing.

The platen 154 additionally includes an annular peripheral rim 308 extending upward from the surface 186 and an annular peripheral and upwardly facing trench 310. The rim 308 defines a substrate receiving pocket 312 in the surface 186 that provides additional protection from substrate slippage at higher angular velocities of the platen 154. In a further embodiment (not shown), the rim 308 may be chamfered, angled, rounded or otherwise adapted to guide the substrate 130 for positioning with a minimal offset from a center of the platen 154.

In one embodiment, in the upper position of the substrate pedestal 126, the peripheral trench 310 interleaves with a downwardly extending inner lip 314 of the inverted shield 136, thus forming a trap for a peripheral flux of the sputtered target material. Such a trap protects the radiant heaters 134 from sputter deposition and extends operational life of the heaters (e.g., IR lamps). The trench 310 includes a bottom member 360 and an upwardly extending finger 362. The bottom member 360 and finger 362 may optionally be coupled to the platen 154 as a replaceable member 364 (as shown in phantom in FIG. 3A).

In alternate embodiments (not shown), the platen 154 may comprise a clamp ring, an electrostatic chuck, embedded substrate heaters, passages for backside (i.e., heat exchange) gas and/or cooling fluid, radio-frequency electrodes, and other means known to enhance a PVD process. Coupling to the respective sources (not shown) of the backside gas, cooling fluid, and electric and radio-frequency power may be accomplished using a conventional means known to those skilled in the art. In one example, the substrate temperature may be controlled by appropriate temperature controllers in a range of −20 to 450 degrees C.

Returning to FIG. 1, the motion control unit 170 generally includes bellows 148, a magnetic drive 144, a displacement drive 140, and a lift pins mechanism 138 that are illustratively mounted on a bracket 152 attached to the chamber body 128. The bellows 148 provide an extendable vacuum-tight seal for the column module 150 that is rotatably coupled (illustrated with an arrow 156) to a bottom plate 192 of the bellows. A vacuum-tight interface between the bracket 152 and the chamber body 128 may be formed using, e.g., one or more o-rings or a crushable copper seal (not shown).

The column module 150 includes a shaft 198 and a plurality of magnetic elements 142 disposed proximate to the magnetic drive 144. In operation, the magnetic drive 144 includes a plurality of stators that may be selectively energized to magnetically rotate the magnetic elements 142, thereby rotating column module 150 and the platen 154. In one exemplary embodiment, the angular velocity of the substrate pedestal 126 is selectively controlled in a range of about 10 to 100 revolutions per minute. It is contemplated that the magnetic drive may be replaced by other motors or drives suitable for rotating the pedestal.

In operation, the flux of the material sputtered from the target 118 may be spatially non-uniform because of variations in the material composition of the target, accumulation of contaminants (e.g., oxides, nitrides, and the like) on the target, mechanical misalignments in the lid assembly 102, and other factors. During film deposition in the PVD chamber 100, the rotational motion of the substrate pedestal 126 can compensate for such spatial non-uniformity of the flux of the sputtered material and deposit, on the rotating substrate 130, highly uniform films. For example, variation in sputtered material from different regions of the target 118 may be averaged across substrate 130 as it rotates, thus resulting in high thickness uniformity of the deposited films. In the illustrated embodiment, it is believed that a thickness uniformity of less than 0.8% (1 sigma) may be achieved. It is appreciated that in other applications, other degrees of thickness uniformity may be achieved. A thickness uniformity of 0.1% to 5% at one sigma may be appropriate for some applications. In others, a thickness uniformity of 0.1% to 0.8% at one sigma may be appropriate. It is further appreciated that in other applications, other features of the rotating pedestal 126 and the tilted target 118 may be utilized.

The displacement drive 140 is rigidly coupled to the bottom plate 192 of the bellows 148 and, in operation, facilitates moving (illustrated with an arrow 184) the substrate pedestal 126 between the lower (i.e., wafer receiving/releasing) position and the upper (i.e., sputtering) position. The displacement drive 140 may be a pneumatic cylinder, hydraulic cylinder, motor, linear actuation or other device suitable for controlling the elevation of the pedestal 126.

As previously mentioned, the magnetron pack 114 includes relatively strong and relatively well balanced magnet poles 114a, 114b. It is believed that a strong magnet tends to reduce sputtering voltage and therefore reduce the acceleration of the ions, such as argon ions, for example, impacting the target surface 220. As a result, the average energy of the sputtered atoms or molecules may be reduced. It is also believed that a relatively well balanced magnet or a unbalanced magnet with a strong central magnetic pole tends to reduce the electron and ion fluxes at the substrate and induces low self-bias potentials (also known as floating potentials). It is believed that such reductions in the energy of the sputtered material, the fluxes of electrons and ions, and the self-bias potentials, can reduce damage to a thin film or other structure on a substrate 130.

In the illustrated embodiment, the poles 114a, 114b of the magnetron pack 114 produce a magnetic field having a field strength of at least 150 gauss measured in a direction parallel to a surface 115 of the poles facing the target 118 at a distance of about one inch from the surface 115 of the poles 114a, 114b. Examples of suitable field strengths parallel to the surface 115 include 310, 330 and 660 gauss, for example.

Also in the illustrated embodiment, each pole 114a, 114b of the magnetron pack 114 produces a magnetic field having a field strength of at least 80 gauss measured in a direction normal to the surface 115 of the associated pole at a distance of about one inch from the surface 115 of the associated pole. Examples of suitable field strengths normal to the surface 115 of the associated pole include 130, 160 and 360 gauss, for a south pole 114a, for example. Additional examples of suitable field strengths normal to the surface 115 of the associated pole include 350, 400 and 900 gauss, for a north pole 114b, for example. It is appreciated that other magnet strengths may be suitable, depending upon the particular application. FIG. 1 shows one example of north-south orientations of the poles of the magnetron pack 114 as represented by the representative poles 114a, 114b. It is appreciated that other north-south orientations may be utilized as well.

It is believed that magnetron rotation can, in general, exacerbate non-uniform voltage distribution effects on the surface of the substrate. A non-uniform voltage distribution on a substrate surface can result in charging damage to thin films or other structures on the substrate. However, it is further believed that a well balanced magnetron can confine electrons to areas close to the target which is believed to enhance protection of thin films or other structures on the substrate 130. In addition, it is believed that a well balanced magnetron has relatively little residual magnetic field on the surface of the substrate 130 which is believed to reduce voltage fluctuations on the substrate surface.

In the illustrated embodiment, the magnetic strength of the center pole 114a is at least half that of the outer poles 114b. Thus, in one embodiment, the magnetic strength of the center pole 114a substantially matches that of the outer poles 114b. Examples of suitable balanced magnetron packs include magnetrons for which the maximum unbalance of the poles is within 0.3 or 0.1. Other suitable magnetrons include an unbalanced magnetron for which the magnetic strength of the center pole 114a is greater than that of the outer poles 114b. Other suitable magnetrons include an unbalanced magnetron for which the magnetic strength of the center pole 114a is weaker than that of the outer poles 114b. It is appreciated that other magnet balances or imbalances may be suitable, depending upon the particular application.

It is further believed that a relatively large offset, both vertical and lateral, between the magnetron pack 114 and the substrate 130, together with a well balanced magnetron pack 114, can also facilitate reduction or elimination of non-uniform voltage distribution on the surface of the substrate 130. In addition to reducing charging damage, it is believed that a well balanced magnetron and large vertical and lateral offsets between the magnetron pack 114 and the substrate 130 can reduce the magnitude of the floating voltage on the substrate which can reduce the acceleration of ions in the plasma sheath region toward the substrate, thereby, it is believed, reducing or eliminating damage to thin films or other structures on the substrate. It is also believed that a relatively well balanced magnet or an unbalanced magnet with a strong central magnetic pole tends to reduce the electron and ion fluxes at the substrate, which can further reduce damage to a thin film or other structure on a substrate 130.

Figure 2:
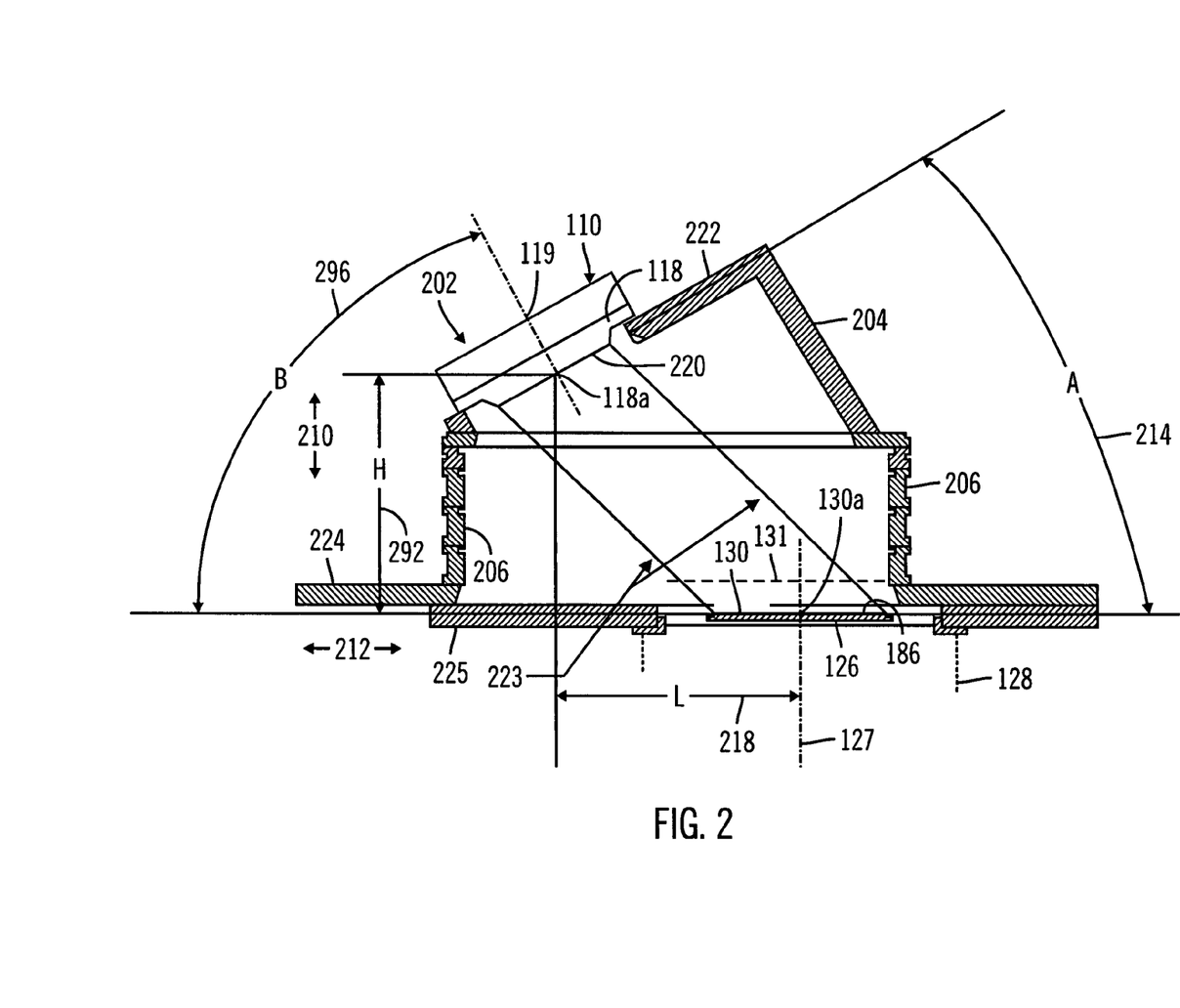
FIG. 2 is a schematic sectional view of another embodiment of a PVD chamber in accordance with the present description.

FIG. 2 depicts a schematic cross-sectional view of another embodiment of a PVD chamber lid assembly 202 having a sputtering target 118 disposed at an angle to and laterally offset from an axis of rotation of the pedestal. The image of FIG. 2 is simplified for illustrative purposes and is not depicted to scale.

The lid assembly 202 generally comprises the target assembly 110, a tilted upper enclosure 204, and, optionally, at least one spacer 206 (one spacer is shown) mounted between the enclosure 204 and the chamber body 128. Illustratively, vacuum-tight coupling between the lid assembly 202, spacers 206, and the main assembly 104 may be provided by using one or more scales or other suitable fasteners.

The target assembly 110 is mounted in the upper enclosure 204 in a tilted position such that an angle A is formed between a sputtering surface 220 of the target 118 and the plane defined by the supporting surface 186 of the rotatable substrate pedestal 126 (or substrate 130). The center 118a of sputtering surface 220 is vertically spaced a distance H from the substrate 130. The center 118a of the sputtering surface 220 may additionally be laterally spaced a distance L, 218 from the center 130a of the substrate 130. For example, the distance L may be selectively set between about zero to about 500 mm. It is believed that in applications in which protection of thin films is to be enhanced, a lateral offset within a range of 300-400 mm, such as 350 mm, for example, may be appropriate. In further embodiment, the lid assembly 202 has a sliding plate 224 which slides along a fixed plate 225 of the main assembly 104 (illustrated with an arrow 212) to adjust the lateral offset between the target 118 and the substrate 130 to enhance deposition performance.

A top panel 222 of the upper enclosure 204 is generally oriented, such that the angle A may be selected in a range from about 15 to about 50 degrees. The tilted target can cause sputtered material of the flux 223 to impact the substrate at an inclined (i.e., non-perpendicular) incidence, which is believed to improve conformal deposition. As the pedestal rotates during deposition, deposition material is deposited on the substrate surface through 360 degrees. It is appreciated that other angles may be suitable, depending upon the particular application. The optimum angle A may be determined for each type of target material and/or substrate surface topography, for example, through pre-production testing. Once optimum angles A are determined, the lid assembly 202 (and target 118) may be inclined at an appropriate angle for each deposition process run.

The spacers 206 may be used to define the optimal vertical distance (illustrated with an arrow 210) between the target 118 and the substrate 130. In one embodiment, a combined height of the optional spacer(s) 206 may selected in a range from greater than about 0 to 500 mm. This allows a distance H spacing the center of the target 118 and the substrate 130 to be selected between about 200 to about 450 mm when the substrate pedestal 154 is in the raised, processing position. Similarly to the angle of target inclination, the spacers 206 may be adjusted to determine the optimal spacing between the substrate and target to achieve best processing results for different target materials and/or substrate topographies. Once the optimum distances are determined, the appropriate number and slack height of the spacers 206 may be utilized to produce optimum deposition results for each process run. It is believed that in applications in which protection of thin films is to be enhanced, a vertical offset within a range of 300-400 mm, such as 350 mm, for example, may be appropriate. It is appreciated that other vertical and lateral offsets may be suitable, depending upon the particular application.

Generally, optimal values of the angle A, height H, and offset L that collectively define, with respect to the rotatable substrate pedestal 126, a spatial position of the target assembly 110 and, as such, an angle of incidence and kinetic energy of atoms the sputtered target material, may be process-specific. In operation, when the target assembly 110 is located in the process-specific optimal spatial position, films having the best properties (e.g., minimal thickness non-uniformity) may be deposited on the substrate 130. Thus, once the optimum angle, spacing and offset are known for predetermined deposition materials and/or substrate topographies the orientation of the lid assembly 202 and target 118 may be set in a predefined orientation to produce a desired process result for a predetermined process run.

In the illustrated embodiment, the target 118 is generally disk-shaped with a flat, symmetrical sputtering surface 220 which defines a central axis coinciding with the axis 119. In the embodiment of FIGS. 1, 2, the axis 119 intersects the plane of the substrate surface (or pedestal supporting surface 186) at an angle B (reference number 296). It is appreciated that nondisk-shaped targets may be utilized including asymmetrical targets. It is further appreciated that nonflat sputtering surfaces may be utilized including convex, concave, conical and cylindrical surfaces, for example.

The sputtering surfaces of these other target types define a center which may be laterally offset from the substrate (or pedestal) center in the same manner as the center 118a of the target 118. Similarly, the sputtering surfaces of these other target types define a central axis similar to the central axis 119 of the target 118. In one embodiment, a central axis of a target having a flat or nonflat sputtering surface may be adjusted between angles B (reference number 296) of about 0 degrees (that is parallel to the substrate surface) to about 90 degrees relative (that is orthogonal) to the substrate surface (or the pedestal surface supporting the substrate). In another embodiment, the target central axis may be adjusted between angles of about 40 to about 75 degrees relative to the substrate surface or support surface.

In one example, the target may be tilted at an angle A substantially equal to 90 degrees such that the target central axis is substantially parallel to the plane of the pedestal surface. The lateral offset of such an embodiment may be substantially equal to zero (that is, substantially no lateral offset) for example.

In another example, the target sputtering surface may be substantially parallel to the plane of the pedestal surface (that is, the sputtering surface central axis is substantially orthogonal to the plane of the pedestal surface) with a substantial lateral offset.

As previously mentioned, a power supply 188 of the support system 160 coupled to the target 118 can provide a biasing voltage applied to the target 118 at a relatively low power. It is believed that such a low biasing power can facilitate a relatively low sputtering voltage which can in turn lower the average energy of the sputtered atoms or molecules. Thus, it is believed that such reduced power can contribute to a reduction or elimination of plasma induced damage to a film on a substrate 130. In the illustrated embodiment, the controller 180 is adapted to control the power of a signal biasing the target 118 within a power range of 50 to 6000 watts. It is appreciated that other power ranges may be suitable, depending upon the particular application.

As previously mentioned, a pump and gas supplies of the support system 160 can provide an intermediate chamber pressure during the sputtering process. In the illustrated embodiment, the controller 180 may be adapted to control the pressure within the chamber within a range of 1 to 7 milliTorr. It is believed that such an intermediate pressure can reduce the energy of the sputtered atoms or molecules, to contribute to a reduction or elimination damage to a film or other structure on a substrate 130. It is appreciated that other pressure ranges may be suitable, depending upon the particular application.

An optional shutter disk 131 (schematically represented by a dashed line), can be used to shield the substrate 130 from plasma spikes in the initial plasma ignition and stabilization stage or to allow target conditioning prior to film deposition.

The shutter disk 131 may then be moved to a storage area in order to expose the whole substrate 130 to the plasma and film deposition. In this manner, exposure of the substrate to the plasma for film deposition may be limited to the period in which plasma has stabilized or after the target has been conditioned (e.g., sputter cleaned).

Figure 4A:
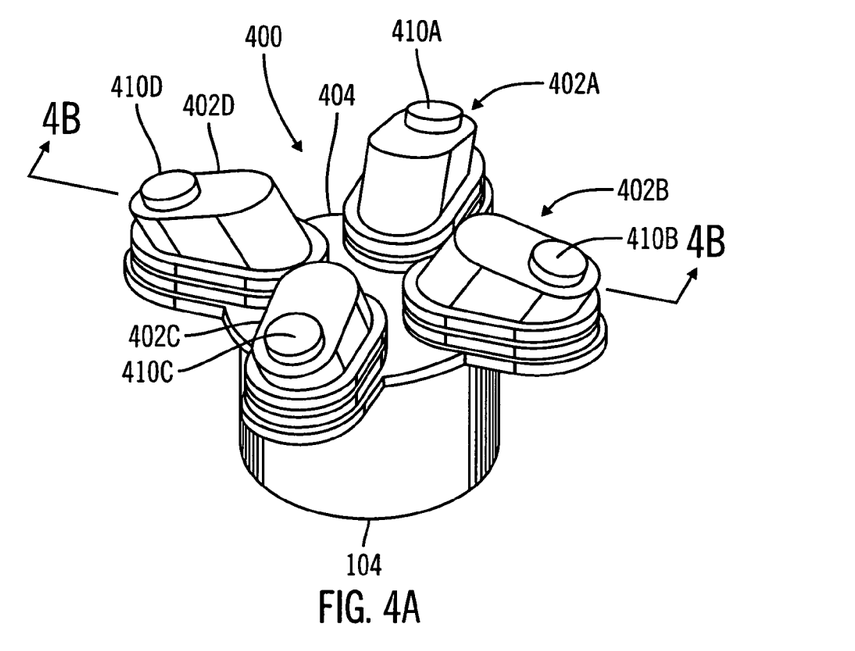
FIG. 4 is a schematic perspective view of another PVD chamber having a plurality of laterally offset sputtering targets disposed around a rotatable substrate pedestal.
Figure 4B:
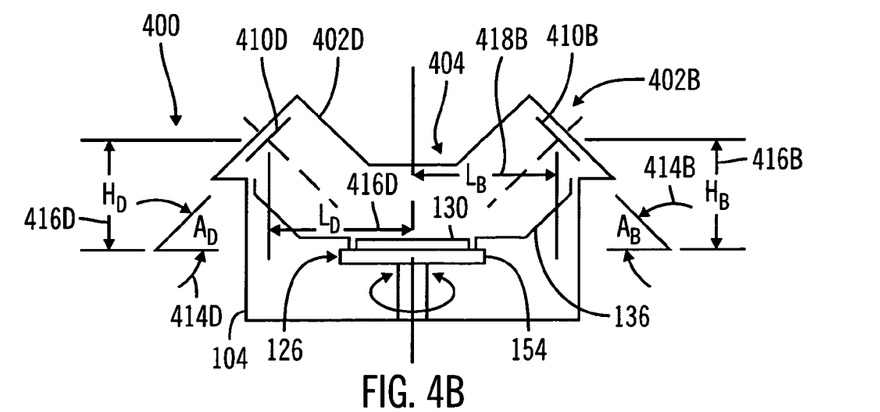

FIGS. 4A-B depict a schematic perspective and sectional views of another PVD chamber 400 comprising a plurality of the lid assemblies (four assemblies 402A-402D are illustratively shown) in accordance with yet another embodiment of the present invention. The image of FIG. 4A is simplified for illustrative purposes and is not depicted to scale. The lid assemblies 402A-D are similar to the lid assembly 202 described above. As such, the reader should refer simultaneously to FIGS. 2 and 4A-B.

Components that are substantially common to the PVD chambers 100 and 400 have been discussed above in reference to FIGS. 1-2. In the PVD chamber 400, the lid assemblies 402A-D are disposed around the rotatable substrate pedestal 126 (shown in FIG. 4B) of the main assembly 104 upon a common flange 404. The common flange 404 is in vacuum-tight contacts with the lid assemblies 402A-D and the main assembly 104. In one embodiment, with respect to the substrate pedestal 126, the lid assemblies 402A-D are disposed on the flange 404 substantially symmetrically. In a further embodiment, spatial positions of each target assembly 410A-410D may be selectively optimized by adjustment of the respective lid assembly 402A-B, as discussed above in reference to the lid assembly 202 and target assembly 110 of FIG. 2. Thus, the orientation of the targets relative to the pedestal may be adjusted laterally, vertically or angularly. For example, the target may be adjusted to an angle relative to the substrate surface (or the pedestal surface supporting the substrate) as shown by angle $A_B$ (reference number 414B) for the lid assembly 402B or the angle $A_D$ (reference number 414D) for the lid assembly 402D, for example. Similarly, the target may be adjusted to a height relative to the substrate surface (or the pedestal surface supporting the substrate) as shown by height $H_B$ (reference number 416B) for the lid assembly 402B or the height $H_D$ (reference number 416D) for the lid assembly 402D, for example. Still further, the center of the target sputtering surface may be adjusted to a lateral offset relative to the center of the substrate surface (or the center of the pedestal surface supporting the substrate) as shown by lateral offset $L_B$ (reference number 418B) for the lid assembly 402B or the lateral offset $L_D$ (reference number 418D) for the lid assembly 402D, for example.

The PVD chamber 400 allows further optimization of properties of the deposited films (e.g., achieving minimal thickness non-uniformity), as well as facilitates in-situ fabrication of complex film structures (e.g., magnetic random access memory (MRAM) structures, metal gate electrode stacks, metal-insulator-metal capacitors, and the like). For example, the PVD chamber 400 where the target assemblies 410A-410D comprise targets 118 formed from different materials may be used to deposit in-situ multi-layered film stacks of highly uniform films of such materials or their mixtures. Moreover, as spatial positions (i.e., target angles, target heights, and target lateral offsets) of each target assembly 410A-D in the apparatus 400 may be individually optimized relative to the rotating substrate pedestal 126 (e.g., angles $A_B$, $A_D$ may not necessarily be equal, heights $H_B$, $H_D$ may not necessarily be equal, lateral offsets $L_B$, $L_D$ may not necessarily be equal, etc), different materials and film stacks may be in-situ deposited with minimal non-uniformity of the film thickness or damage to underlying layers.

Copending U.S. application Ser. No. 11/260,899, filed concurrently herewith, and entitled "Thin Film Deposition" and assigned to the assignee of the present application and incorporated by reference in its entirety, is directed a system capable of producing layers of various materials stacked on one another on a substrate without exposing the substrate to the pressure and contaminants of ambient air until the stack is complete. The stack of layers can include both insulative layers such as a layer of silicon dioxide or hafnium oxide, for example, and conductive metal layers such as a layer of tantalum nitride or ruthenium tantalum alloy, for example. Such stacks may have a variety of applications including use as a gate stack of a MOS transistor, for example. The PVD chambers of the present application may be used in such a system to deposit a metal conductive layer or to deposit a dielectric layer, or both in a stack.

Figure 5:
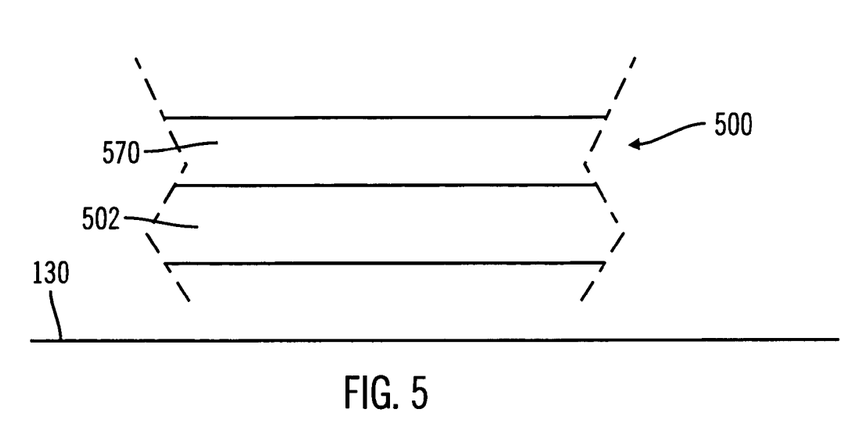
FIG. 5 illustrates an example of a plurality of deposited layers in accordance with one aspect of the present description.

FIG. 5 illustrates one example of a plurality 500 of layers on a substrate 130 in which at least one of the layers has been deposited using an offset sputtering PVD chamber such as the chamber 100 or the chamber 400, for example. In this example, the plurality 500 of deposited layer includes both an insulation layer 502 and a conductive layer 570. It is appreciated that other types of deposited layers including insulative layers, and conductive layers, in various combinations, may be fabricated as well, depending upon the particular application.

In one example of the description provided herein, a gate stack which includes both an insulation layer and a metal gate electrode layer may be formed on a substrate. It is appreciated that other types of stacks of metal layers, insulative layers, and conductive layers, in various combinations may be fabricated as well, depending upon the particular application. For example, full silicidation of polysilicon gates, otherwise known as FUSI, may be combined with a deposited metal layer as nickel or cobalt, for example, to form a metal-silicide gate such as a nickel-silicide gate.

Another example of a plurality of layers formed in accordance with the descriptions provided herein is a Magnetoresistive Random Access Memory (MRAM) which functions by changing the spin of electrons in thin film layers of magnetic material. Typical MRAM materials are: NiFe, NiFeCo, CoFe, Co, Cu, Ta, Ti, Zr, Au, Ru, Cr, CoPt, CoCrPt, $Al_2O_3$, $SiO_2$, FeNi, FeTa, FeTaCr, FeAl, FeZr, NiFeCr, NiFeX. Anti-ferromagnetic materials are: FeMn, MnNi, MnPt, MnIr, and MnPdPt. One example of an MRAM stack is a silicon substrate on which is deposited a Ta buffer seed layer, on which is deposited a 120 angstrom MnPt pinning layer, on which is deposited an 18 angstrom CoFe pinned magnetic layer, on which is deposited an 8 angstrom Ru pin enhance layer, on which is deposited a 28 angstrom CoFe pinned magnetic layer, on which is deposited a 7 angstrom $Al_2O_3$ tunnel junction layer, on which is deposited a 15 angstrom CoFe free magnetic layer, on which is deposited a 25 angstrom NiFe free magnetic layer, on which is deposited a Ta cap protection layer. Some or all of these layers may be deposited in accordance with the description provided herein. Other layers which may be deposited in accordance with the description provided herein include liner, barrier, adhesion, seed or nucleation layers and cap layers.

For deposition of insulation layer such as the layer 502, an offset sputtering PVD chamber, such as the chambers 100, 400, for example, may have a target of suitable material such as silicon or hafnium silicide (HfSi), for example. Other target materials may be used, depending upon the particular application. In addition, various working and deposition gases may be admitted into the chamber during the deposition process. For example, oxygen may be admitted during the sputtering of a HfSi target to produce a suitable dielectric film or layer of HfSiOx on the substrate 130. For some applications an insulation layer having a high K property is appropriate. It is appreciated that other types of insulation films may be deposited, depending upon the particular application. Additional examples of suitable metal gate dielectrics include tantalum oxide (TaOx), hafnium oxide (HfOx), etc. Dielectric films deposited using offset sputtering PVD chambers in accordance with the present description may be used in a variety of other applications including capacitors.

An insulation layer deposited using offset sputtering PVD chambers in accordance with the present description may have a variety of thicknesses. In accordance with one aspect, such insulation or dielectric layers may be deposited to very thin thicknesses. For example, it is believed that an insulation layer may be deposited to a thickness below 10 nanometers (100 angstroms). Additional thickness embodiments are discussed below. The insulation layer may be deposited in a single film or in a plurality of insulative films built-up, one upon another. Other thicknesses may be used, depending upon the particular application.

A conductive layer such as the layer 570, may be deposited in an offset sputtering PVD chamber such as the chamber 100 or 400, for example. For depositing a conductive metal layer, such as a metal gate electrode layer or capacitor electrode layer, the material or materials of the electrode layers may be selected from a variety of conductive metals, metal alloys and semiconductors including tantalum, tantalum nitride, TaxRuy, TaSixNy, hafnium, hafnium nitride, tungsten, tungsten nitride, ruthenium, ruthenium oxide, platinum, titanium, titanium nitride, etc. The thicknesses of the conductive films or layers may also vary, depending upon the particular application. In the illustrated embodiment a thin conductive layer such as a metal gate electrode layer may have a thickness below 10 nanometers (100 angstroms), such as in a range of 5-30 angstroms, for example, and the bulk metal gate electrode layer has a thickness in a range of 30-600 angstroms, for example. Additional thickness embodiments are discussed below. The conductive layer may be deposited in a single film or in a plurality of conductive films built-up, one upon another. It is appreciated that the thicknesses may vary, depending upon the particular application.

As previously mentioned, an offset sputtering physical vapor deposition chamber such as the chamber 100 or 400, for example, can reduce or eliminate damage to an underlying insulative layer 502 on which the conductive layer 570 is deposited. A thin layer of film deposited by this PVD process may also be used to modulate the effective work function of a multilayer structure such as a metal gate stack, and/or may be used as a glue layer to enhance the adhesion between certain insulative films and metal films.

In one embodiment, a thin conductive layer 570 may function as a protective layer for an underlying insulation layer 502. A subsequent bulk metal gate electrode layer may then be deposited in the same or another chamber such as a conventional PVD chamber, for example. Such a sandwiched structure may have a variety of beneficial properties including a work function which is modulated by the sandwiched structure. It is believed that work function of a metal gate stack may be a function of both the work function of the layer 570 and the overlying bulk layer if the layer 570 is sufficiently thin, such as 30 angstroms or less, for example. In addition, the layer 570 may protect the insulation layer 502 from some damage which may be caused by the deposition of the bulk layer. Still further, the layer 570 may act as an effective diffusion barrier to retard the diffusion of gate electrode materials from diffusing into dielectrics and silicon. Yet another example is to use layer 570 to enhance adhesion between layer 502 and another layer deposited on the layer 570.

It is appreciated that other features of the layer 570 may be utilized either in addition to or instead of those described herein, depending upon the particular application. For example, in another embodiment, the layer 570 may be deposited to a sufficient thickness such that the conductive layer 570 itself functions as an electrode layer, obviating the need for separate protective and bulk layers in some applications. It is believed that a conductive layer 570 may be deposited by an offset sputtering PVD chamber in accordance with the present description, with so little damage, if any, to the underlying insulative layer 502, that the conductive layer 570 deposited directly on the insulative layer 502 may be adapted for a variety of applications including gate stack electrodes, capacitor electrodes, interconnects, etc without any intervening protective layer or layers. In one embodiment, it is believed that interface trap density ($D_{it}$) may be reduced in a metal-oxide-semiconductor (MOS) capacitor to less than $10^{11}$ cm$^{-2}$ eV$^{-1}$.

The thickness at which a functioning conductive layer 570 is deposited may depend upon the function being performed such as functioning as a gate electrode, a capacitor electrode, etc. A thickness such as 50-500 Angstroms, or thicker, for example, may be suitable for a variety of applications. In another embodiment, a conductive layer 570 having a thickness in a range of 5 nm (50 Angstroms) to 10 nm (100 Angstroms). In other applications, an ultra thin conductive layer 570 having a thickness less than 50 Angstroms, for example, may be appropriate. In another embodiment, a conductive layer 570 having a thickness in a range of 0.2 nm (2 Angstroms) to 40 nm (400 Angstroms).

It is appreciated that the various layers of a structure need not all be deposited by an offset sputtering PVD chamber. Thus, for example, an insulation layer 502 may be deposited by an offset sputtering PVD chamber in accordance with the description provided herein and one or more other layers including a conductive layer 570 may be deposited by other types of chambers including conventional PVD chambers, atomic layer deposition chambers and chemical vapor deposition chambers, for example. Conversely a conductive layer 570 may be deposited by an offset sputtering PVD chamber in accordance with the description provided herein and one or more other layers including an insulative layer 502 may be deposited by other types of chambers including conventional PVD chambers, atomic layer deposition chambers and chemical vapor deposition chambers, for example.

A conductive layer 570 may be deposited by an offset sputtering PVD chamber 100, 400 in a low deposition rate to reduce damage to the underlying insulation layer 502. During deposition of the thin metal gate electrode layer 570, power to the target 118 may be relatively low, such as 50-2000 watts, for example or 100-500 watts, for example. In addition, the chamber interior pressure may be relatively high, such as 3-10 milliTorr, for example. Still further, a relatively balanced magnetron or a unbalanced magnet with a strong central magnetic pole may be used to reduce ionization of the deposition material. A low power, low ionization, high pressure deposition may reduce damage to the underlying insulative layer 502. As previously mentioned, the conductive layer 570 may itself function as an electrode or other conductive device obviating the need for a bulk conductive layer or an intervening protective layer. Alternatively, following deposition of the conductive layer 570, a bulk gate electrode layer may be deposited in the same or different chamber at a substantially higher deposition rate if appropriate for the particular application. If a bulk conductive layer is deposited in a PVD chamber, power to the target may be relatively high, such as 500-5000 watts, for example. In addition, the pressure may be relatively low, such as 1-5 milliTorr, for example, to reduce scattering. It is appreciated that in other applications, a conductive layer may be deposited in a single layer or in more than two layers, depending upon the particular application.

During deposition of a conductive layer 570, various working and deposition gases may be admitted into the chamber during the deposition process. For example, argon and nitrogen may be admitted during the sputtering of a metal target to produce a suitable conductive metal film or layer 570 on the insulation layer 502. Such conductive metal materials may include tantalum, tantalum nitride, titanium, and titanium nitride, for example as described above. It is appreciated that other types of conductive metal films may be deposited, depending upon the particular application.

In one aspect of the illustrated embodiments, the bias signal applied to the target 118, 410A-410D may be pulsed in a manner which can reduce arcing, particularly when sputter deposit an insulative film. In the illustrated embodiment, the bias signal applied to the target includes a plurality of alternating first and second intervals wherein in each of the first intervals, the voltage of the applied bias signal is negative to attract ions to sputter the target. In the alternating second intervals, the applied bias signal has a positive voltage to repel positively charged ions from the target to reduce arcing.

It is appreciated that a pulsed bias signal applied to a target may provide other features, depending upon the particular application. For example, it is believed that other potential features, depending upon the particular application, include a reduction in deposition rate, a more stable plasma, and increased peak energy in the plasma for effective chemistry in multi-component films. For example, films which are closer to true stoichiometric proportions might be obtained when a pulsed biasing signal is applied to a target 118 having stoichiometric sputtering materials. Sill other possible features include an increase in film quality, particularly for multi-component films which include materials such as titanium nitride, tantalum nitride, $TaSi_xN_y$, etc. It is also believed that film sheet resistance may be reduced, due to possible elimination of micro voids and columnar structures, when a pulsed bias is applied. It is appreciated, however, in some applications, a nonpulsed biasing signal, that is, a DC bias signal, may be applied to bias the target 118, depending upon the particular application. For example, when sputtering a conductive metal target, a nonpulsed bias applied to the target may be appropriate, depending upon the particular application.

In addition to alternating the voltage of the bias signal applied to the target 118, the power applied to bias the target may be modulated in a plurality of alternating first and second intervals wherein in each of the first intervals, the power level is at a first level sufficiently high to sputter the target 118. In some applications, the power may also be high enough to maintain a plasma adjacent to the target capable of ionizing target material sputtered from the target. However, in many applications the power may be limited to reduce or eliminate ionization of the deposition material. In each of the second intervals, the power may be low as a positive bias voltage is applied to the target. As a consequence, of the low power and positive voltage, little or no sputtering of the target may occur in this interval. The overall sputtering rate will be an average of the sputtering rates in the alternating intervals. As a consequence, the average sputtering rate can be sufficiently low to facilitate thin film deposition. In the illustrated embodiment, the durations of the first intervals of higher power, negative voltage application can be selected to be longer than the durations of the second intervals of lower power, positive voltage application to provide a suitable deposition rate. Alternatively, the durations of the first intervals of higher power, negative voltage application can be selected to be shorter than the durations of the second intervals of lower power, positive voltage application to reduce further the average of the power applied to the target and thus to reduce the deposition rate further.

Pulsed biasing of the target 118 may be beneficial for depositing a variety of films including thin films. Additional examples of thin films which may be deposited in accordance with the descriptions provided herein may include sputtering processes which sputter W, Ni, Co, RuTa, NiFe, Ta, etc., or reactive sputtering processes which form oxides and nitrides including $W_xN_y$, $Hf_xN_y$, $TaSi_xN_y$, $Ru_xO_y$, $Ta_xO_y$, etc. It is appreciated that other materials including metals, metal alloys, semiconductors and insulators, may be sputtered, either in a direct deposition, or in a reactive deposition, depending upon the particular application. Reactive gases for reactive sputtering processes in the chamber include $N_2$, $O_2$, $CH_4$ and $NH_3$.

Figure 6:
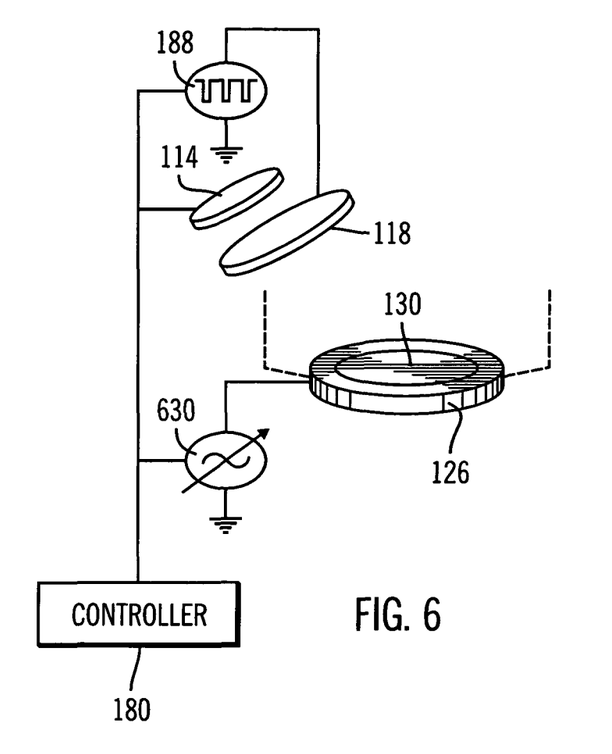
FIG. 6 is a schematic representation of electrical interconnections of various components of the sputtering chamber of FIG. 1.
Figure 7:
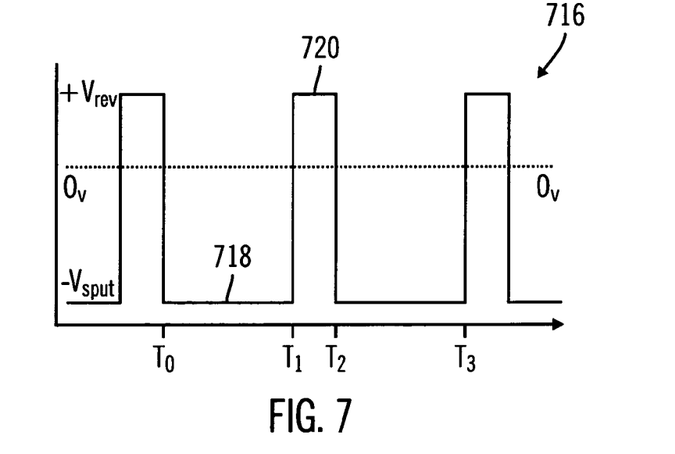
FIG. 7 is a graph depicting a voltage pulse train for biasing the target of FIG. 1 in accordance with one embodiment of the present description.

FIG. 6 is a schematic representation of certain electrical connections of the offset sputtering PVD chamber of the illustrated embodiment. To attract the ions generated by the plasma to sputter the target 118, the target 118 is in one embodiment alternately negatively and positively biased by a pulse type power source 188 to provide an average power of 0.5-4 kW, for example. A schematic diagram of one example of a suitable voltage pulse train 716 for biasing the target, is depicted in FIG. 7. The voltage pulse train 716 includes a plurality of negative voltage pulses 718 alternating with positive voltage pulses 720. Application of the voltage pulse train 716 results in a power pulse train, a schematic representation of which is indicated at 822 in FIG. 8.

Figure 8:
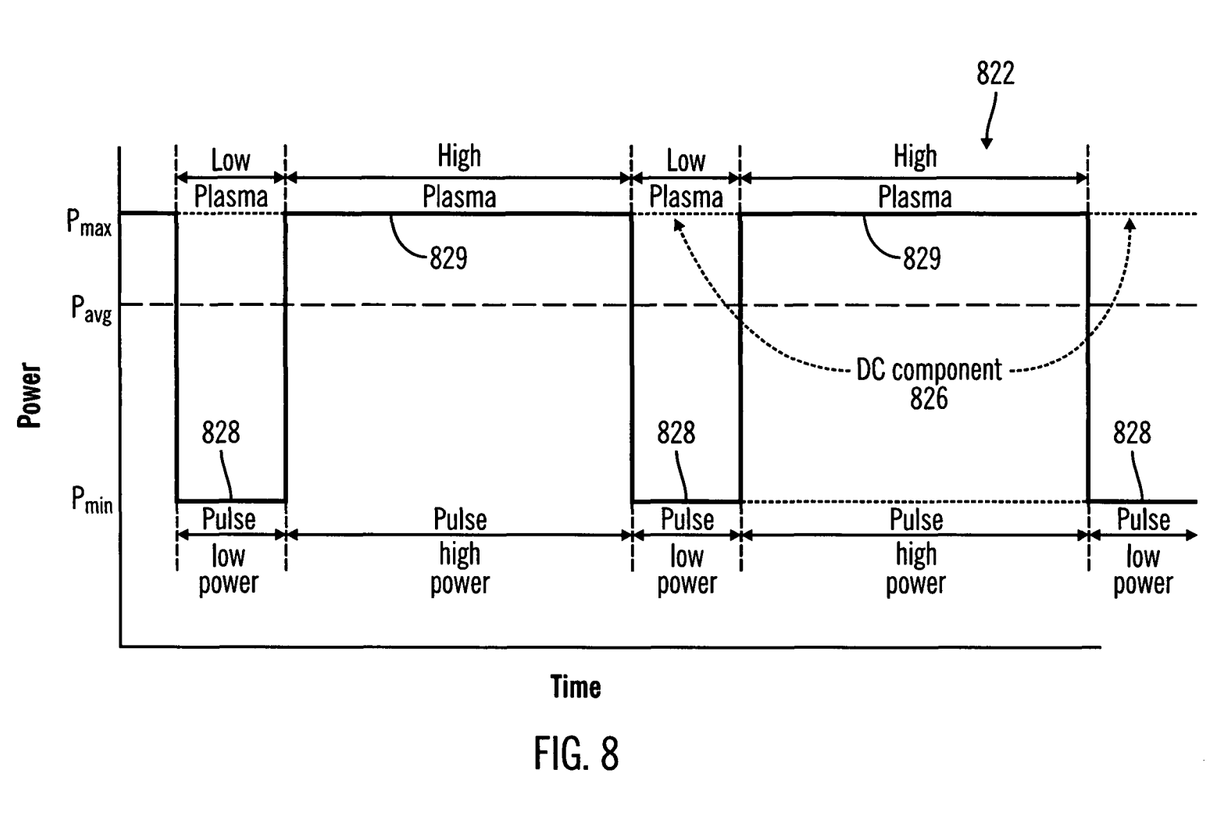
FIG. 8 is a graph depicting a power pulse train for biasing the target of FIG. 1 in accordance with one embodiment of the present description.

The power pulse train 822 includes a plurality of pulses superimposed on a DC component 326. The DC component of the source 314 results from the negative voltage pulses 718 which negatively bias the target 118 to about −200 to −600 VDC with respect to the chamber shield 309 to ignite and maintain the plasma, at least during the duration of each negative voltage pulse 718. A voltage less than −1000 VDC is generally suitable for many applications. In the illustrated embodiment, the DC component 326 of the pulse train 502 represents the maximum power $P_{max}$ of the pulse train. A target power of between 0.1 and 5 kW is typically used to ignite a plasma while a greater power of greater than 10 kW is often preferred for self ionizing plasma (SIP) sputtering. In this embodiment, a suitable power ranges for the maximum power $P_{max}$ of the power pulse train 822 is believed to include 50 watts to 20,000 watts, or 0.1 to 10 kW with a range of 500 watts to 4 K watt suitable for many applications. This maximum power is applied to negatively bias the target to maintain a plasma and to sputter the target to deposit a film on the wafer.

Superimposed on the DC component is the plurality of pulses of the pulse trains 822, each of which alternates between a "pulse low power" interval 828 in which the power minimum $P_{min}$ is applied to the target as a positive voltage pulse 720 is applied to the target, and a "pulse high power" interval 829 in which a power maximum as represented by $P_{max}$ is applied to the target as the negative voltage pulse 718 is applied to the target. During each "pulse low power" interval, the power applied to the target is relatively low. As a consequence, the plasma density adjacent the target, the target sputtering rate and the deposition material ionization rate are all relatively low or extinguished during each pulse low power interval.

During each "pulse high power" interval, power $P_{max}$ applied to the target is higher. As a consequence, the plasma density adjacent the target and the target sputtering rate are higher during each pulse high interval. In the one embodiment, the power level $P_{max}$ of each pulse high interval may be sufficiently limited to avoid or reduce a self ionizing plasma (SIP) to reduce or avoid the ionization of a significant portion of the material being sputtered from the target during each pulse high period, if appropriate, depending upon the application. For example, ionization of the deposition material may be reduced or avoided to reduce or eliminate damage to the insulative layer. However, in some applications, ionization of deposition material may be appropriate to facilitate bottom coverage of deep aspect ratio holes yet maintaining a sufficiently low average sputtering rate to facilitate thin film depositions.

Although the sputtering rate of the target may rise substantially during each pulse high interval, it is appreciated that the average power $P_{avg}$ applied to the target is lower than the maximum power $P_{max}$. Consequently, the average sputtering rate will similarly be lower than the sputtering rate during the pulse high intervals alone. For thin film applications, it is believed that a suitably low average sputtering rate may be achieved by appropriate selections of the high and low power levels, $P_{max}$ and $P_{min}$, and the durations of the respective pulse low and pulse high intervals. For many such applications, it is believed that providing pulse high power intervals longer in duration than pulse low power intervals may provide suitable results.

In the illustrated embodiment, deposition of a thin layer may be accomplished in 30 seconds for example. During this 30 second deposition period, the power supply to the target may be pulsed at a frequency of 25 Khz, for example, Thus, the period T0 to T2 of FIG. 7 would be 40 micro seconds. A frequency in the range of 0-350 KHz is believed suitable for a number of applications. The duty cycle of the voltage pulse train 716 may be 0-50%, for example. Thus, at 25 KHz, the interval T1 to T2 may be 0-20 microseconds, for example. The pulse frequency may vary, depending upon the application. Also, the duration of the positive pulse may vary as well. Values for the parameters including $P_{max}$, $P_{min}$, and the interval durations may be determined empirically. These parameters may be affected by the particular design goals of the application including plasma characteristics, repeatability of results, the thickness of the deposited layer and the uniformity of the deposited layer. For repeatability of results, a deposition of at least 8-10 seconds is often suitable. A deposition rate of 0.02 nanometers/second (0.2 Angstroms/second) to 0.6 nanometers/second is suitable for a number of applications. In other applications, a deposition rate of 0.01 nanometers/second (0.1 Angstroms/second) to 4 nanometers/second (40 Angstroms/second) is suitable. It is appreciated that the deposition rate may vary, depending upon the particular application. In the illustrated embodiment, an average power $P_{avg}$ in the range of 500 W-4000 W for material such as Ti and Ru is believed to be suitable.

In the illustrated embodiment, the values $P_{max}$, $P_{min}$, and the pulse high and pulse low interval durations are depicted as being relatively constant from interval to interval. It is appreciated that these values may vary from interval to interval, and within each interval, depending upon the particular application. Moreover, the voltage or current output of the source 314 may be modulated as appropriate.

A layer such as the insulation layer 502 or the conductive layer 570 may be deposited by an offset sputtering PVD chamber in accordance with the present description to a thickness below 10 nanometers (100 angstroms), for example. The insulation layer 502 may in some applications be deposited to form a layer even more thin such as thicknesses of 50, 30, 25 or 20 angstroms, for example. In yet other applications in which an ultra thin deposition is suitable, a layer may be deposited by an offset sputtering PVD chamber in accordance with the present description to a thickness below 5 nanometers (50 angstroms), for example. The deposited layer may in some applications be even thinner including thicknesses below 0.5 nanometers (5 angstroms). Each layer may be deposited in a single film or in a plurality of insulative films built-up, one upon another. Other thicknesses may be used, depending upon the particular application.

In those applications in which the ionization of deposition material is to be reduced or avoided, the wafer 130 may be left floating electrically. In another applications, the wafer may be biased to attract or repel ions as appropriate for that application.

For example, a source 630 may be provided to apply RF power to the pedestal electrode to bias the wafer 130 to attract deposition material ions during SIP sputter deposition. In addition, the source 630 may be configured to apply RF power to the pedestal electrode 126 to couple supplemental energy to the plasma. During SIP deposition, the pedestal 126 and hence the wafer 130 may be left electrically floating, but a negative DC self-bias may nonetheless develop on it. Alternatively, the pedestal 126 may be negatively biased by a source at a negative voltage of −30 VDC, for example, to negatively bias the wafer 130 to attract the ionized deposition material to the substrate. In yet another alternative, the wafer 130 may be left floating electrically. The source 630 may be a DC, pulsed DC or RF power supply, for example.

If the source 630 biasing the wafer through the pedestal is an RF power supply, the supply may operate at a frequency of 13.56 MHz, for example. Other frequencies are suitable such as 60 MHz, depending upon the particular application. The pedestal 126 may be supplied with RF power in a range of 10 watts to 5 kW, for example, a more preferred range being 150 to 300 W for a 200 mm wafer in SIP deposition.

The above-mentioned power and voltage levels and frequencies may vary of course, depending upon the particular application. A computer-based controller 180 may be programmed to control the power levels, voltages, currents and frequencies of the various sources in accordance with the particular application.

A gas source of the support system 160 supplies a sputtering working gas, such as, for example, the chemically inactive noble gas argon, to the chamber. The sputtering working gas can be neon, argon, krypton, xenon, or a mixture of two or more gases from the aforementioned gases, depending on the target materials, substrate materials, and applications. It is believed that certain combinations of the sputtering gas, the substrate material, and the sputtered material may further reduce the damage to the substrate. A reactive PVD system may utilize nitrogen from a source of the source system 160 to form a nitride such as tantalum nitride or titanium nitride to be deposited as a film on the substrate. Another reactive PVD system may utilize oxygen from a source to form an oxide film for deposition. Examples of such an oxide film include silicon dioxide or hafnium silicon oxide films. Methane is useful for forming a carbide film such as tantalum carbide or tantalum carbide nitride. Thus, reactive gases for reactive sputtering processes in the chamber include $N_2$, $O_2$, $CH_4$ and $NH_3$. Other working gases and reaction gases may be provided as well.

For those PVD chambers which may utilize gases such as toxic gases or other gases having additional handling protocols, the support systems 160 may include a combination pump which includes a cryogenic pump and a turbomolecular pump. In the illustrated embodiment, the cryogenic pump has a single stage adapted to absorb water vapor for example, but lacks a second stage which would typically absorb additional gases such as oxygen or methane. Absorption of certain gases may not be in accordance with the handling protocols for those particular gases. Rather than absorbing the gases in a second stage of cryogenic pump, these additional gases may be pumped away by the turbomolecular pump. It is appreciated that the combination pump may be used to achieve an appropriate vacuum and is flexible enough to pump a variety of gases and vapors including, for example, $O_2$, $N_2$, Ar, $CH_4$, $H_2$, etc. For example, the PVD chamber may be used to deposit dielectric films as well as conductive metal films.

The foregoing description of various embodiments has been presented for the purposes of illustration. It is not intended to be exhaustive or to limit to the precise form disclosed. Many modifications and variations are possible in light of the above teaching.

We claim:

1. A method for physical vapor deposition comprising:
    forming a gate of a transistor on a semiconductor wafer substrate, said forming including:
        rotating a magnetron adjacent a target;
        rotating said semiconductor wafer substrate on a pedestal support surface in a chamber body;
        sputtering a surface of the target to deposit target material on a surface of said substrate in a layer of said gate wherein said gate layer has a thickness less than 100 angstroms; and
        inhibiting plasma damage to underlying material of said gate while depositing said layer, said inhibiting including laterally offsetting the target sputtering surface with respect to the center of the substrate surface within a range of 300 to 400 mm.

2. The method of claim 1 wherein the magnetron has a center pole and at least one outer pole wherein said inhibiting includes the magnetic strength of the center pole being at least half that of the outer poles.

3. The method of claim 1 wherein said inhibiting further includes controlling the pressure within said chamber within a range of 1 to 7 milliTorr.

4. The method of claim 1 further comprising providing a working gas within said chamber wherein said working gas is selected from a group consisting of neon, argon, krypton, xenon, and a mixture of two or more gases from selected from the group consisting of neon, argon, krypton, xenon.

5. The method of claim 1 further comprising providing a reactive gas within said chamber wherein said reactive gas is selected from a group consisting of $N_2$, $O_2$, $CH_4$, and $NH_3$.

6. The method of claim 1 wherein said inhibiting further includes controlling the power of a signal biasing said target within a power range of 50 to 6000 watts.

7. The method of claim 1 wherein said inhibiting further includes disposing the target sputtering surface at an angle between about 0 to about 90 degrees with respect to the pedestal surface plane.

8. The method of claim 1 wherein said target sputtering surface has a central axis which is substantially parallel with respect to said pedestal surface plane.

9. The method of claim 1 wherein said target sputtering surface has a central axis which is substantially orthogonal with respect to said pedestal surface plane.

10. The method of claim 1 wherein said inhibiting further includes disposing the target central axis at an angle between about 40 to about 75 degrees with respect to the pedestal surface plane.

11. The method of claim 7 wherein said inhibiting further includes disposing the target sputtering surface at an angle between about 15 to about 50 degrees with respect to the pedestal surface plane.

12. The method of claim 1 wherein said inhibiting further includes vertically offsetting said target sputtering surface center with respect to said substrate center within a range of 300 to 400 mm.

13. The method of claim 1 wherein the magnetron has poles and wherein said inhibiting includes said poles producing a magnetic field having a total field strength of at least 50 gauss at the surface of poles.

14. The method of claim 1 further comprising controlling the substrate temperature in a range of −20 degrees C. to 450 degrees C.

15. A method, comprising:
    forming a gate of a transistor on a semiconductor wafer substrate, said forming including:
        rotating a magnetron adjacent a target;
        rotating said semiconductor wafer substrate on a pedestal supporting surface in a chamber body;
        sputtering a surface of a target to deposit a layer of conductive material of said gate wherein said gate conductive layer has a thickness less than 50 nm directly on a layer of insulative material of said gate; and
        inhibiting plasma damage to said layer of gate insulative material while depositing said gate conductive layer, said inhibiting including laterally offsetting the target sputtering surface with respect to the center of the substrate within a range of 300 to 400 mm.

16. The method of claim 15 wherein said layer of conductive material is 40 nm or less in thickness.

17. The method of claim 16 wherein said layer of conductive material is 5 nm or less in thickness.

18. The method of claim 15 wherein said layer of conductive material is a protective layer for said underlying insulative layer, said method further comprising depositing an electrode layer on said protective layer.

19. The method of claim 15 wherein said layer of conductive material is an electrode layer deposited to a thickness in a range of approximately 0.2 to 40 nm and is deposited in the absence of an intervening protective layer between said electrode layer and said underlying insulative layer.

20. The method of claim 19 wherein said electrode layer is deposited to a thickness in a range of approximately 5 to approximately 10 nm.

21. The method of claim 15 wherein said layer of conductive metal material is deposited at a rate of 0.01-4 nm per second.

22. The method of claim 21 wherein said layer of conductive metal material is deposited at a rate of 0.02-0.6 nm per second.

23. The method of claim 15 wherein said layer of conductive material is deposited at a uniformity of 0.1% to 5% at one sigma.

24. The method of claim 23 wherein said layer of conductive material is deposited at a uniformity of approximately 0.1% to 0.8% at one sigma.

25. The method of claim 15, wherein said inhibiting includes disposing the target sputtering surface at an angle between about 0 to about 90 degrees with respect to the pedestal surface plane.

26. The method of claim 25, wherein said inhibiting includes disposing the target sputtering surface at an angle between about 15 to about 50 degrees with respect to the pedestal surface plane.

27. The method of claim 15, wherein said inhibiting includes vertically offsetting said target sputtering surface center with respect to said substrate center within a range of 300 to 400 mm.

28. The method of claim 15 wherein the magnetron has poles and wherein said inhibiting includes producing a magnetic field having a total field strength of at least 50 gauss at the surface of poles.

29. The method of claim 15, wherein said inhibiting further includes controlling the power of a signal biasing said target within a power range of 50 to 6000 watts.

30. The method of claim 15 further comprising providing a working gas within said chamber wherein said working gas is selected from a group consisting of neon, argon, krypton, xenon, and a mixture of two or more gases from selected from the group consisting of neon, argon, krypton, xenon.

31. The method of claim 15 further comprising providing a reactive gas within said chamber wherein said reactive gas is selected from a group consisting of $N_2$, $O_2$, $CH_4$, and $NH_3$.

32. The method of claim 15 further comprising controlling the substrate temperature in a range of −20 degrees C. to 450 degrees C.

33. A method, comprising:
forming a gate of a transistor on a semiconductor wafer substrate, said forming including:
rotating a magnetron adjacent a target;
rotating said semiconductor wafer substrate on a pedestal support surface in a chamber body; and
sputtering a surface of a target to deposit a layer of insulative material of said gate on said substrate wherein said gate layer has a thickness less than 100 angstroms; and
inhibiting plasma damage to underlying material of said gate while depositing said layer, said inhibiting including laterally offsetting the target sputtering surface center with respect to the center of the substrate within a range of 300 to 400 mm.

34. The method of claim 33 wherein said layer of insulative material is 5 nm or less in thickness.

35. The method of claim 33 wherein said inhibiting includes depositing said layer of insulative material at a rate of 0.01-4 nm per second.

36. The method of claim 35 wherein said inhibiting includes depositing said layer of insulative material at a rate of 0.02-0.6 nm per second.

37. The method of claim 33 wherein said layer of insulative material is greater than 5 nm in thickness.

38. The method of claim 33 wherein said layer of insulative material is deposited at a uniformity of 0.1% to 5% at one sigma.

39. The method of claim 38 wherein said layer of insulative metal material is deposited at a uniformity of 0.8% or better at one sigma.

40. The method of claim 33, wherein said inhibiting further includes disposing the target sputtering surface at an angle between about 15 to about 50 degrees with respect to the pedestal surface plane.

41. The method of claim 33, wherein said inhibiting further includes vertically offsetting said target sputtering surface center with respect to said substrate center within a range of 300 to 400 mm.

42. The method of claim 33 wherein the magnetron has poles and wherein said inhibiting further includes producing a magnetic field having a total field strength of at least 50 gauss at the surface of poles.

43. The method of claim 33, wherein said inhibiting further includes controlling the power of a signal biasing said target within a power range of 50 to 6000 watts.

44. The method of claim 33 further comprising providing a working gas within said chamber wherein said working gas is selected from a group consisting of neon, argon, krypton, xenon, and a mixture of two or more gases from selected from the group consisting of neon, argon, krypton, xenon.

45. The method of claim 33 further comprising providing a reactive gas within said chamber wherein said reactive gas is selected from a group consisting of $N_2$, $O_2$, $CH_4$, and $NH_3$.

46. The method of claim 33 further comprising controlling the substrate temperature in a range of −20 degrees C. to 450 degrees C.

\* \* \* \* \*